US012622156B2

(12) United States Patent
Miao

(10) Patent No.: US 12,622,156 B2
(45) Date of Patent: May 5, 2026

(54) DISPLAY PANEL ENCAPULATION STRUCTURE AND METHOD OF MANUFACTURING THE SAME

(71) Applicants: Huizhou China Star Optoelectronics Display Co., Ltd., Huizhou (CN); Shenzhen China Star Optoelectronics Semiconductor Display Technology Co., Ltd., Shenzhen (CN)

(72) Inventor: Yang Miao, Huizhou (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 39 days.

(21) Appl. No.: 17/605,022

(22) PCT Filed: Sep. 3, 2021

(86) PCT No.: PCT/CN2021/116455
§ 371 (c)(1),
(2) Date: Mar. 2, 2023

(87) PCT Pub. No.: WO2023/024150
PCT Pub. Date: Mar. 2, 2023

(65) Prior Publication Data
US 2024/0023409 A1      Jan. 18, 2024

(30) Foreign Application Priority Data
Aug. 25, 2021      (CN) .......................... 202110983020.5

(51) Int. Cl.
| | |
|---|---|
| *H10K 59/80* | (2023.01) |
| *H10K 59/12* | (2023.01) |
| *H10K 102/00* | (2023.01) |

(52) U.S. Cl.
CPC ....... *H10K 59/873* (2023.02); *H10K 59/1201* (2023.02); *H10K 2102/351* (2023.02)

(58) Field of Classification Search
CPC ............. H10K 59/873; H10K 59/1201; H10K 2102/351
(Continued)

(56) References Cited

U.S. PATENT DOCUMENTS

| | | | |
|---|---|---|---|
| 6,548,912 B1* | 4/2003 | Graff .................. | H10K 50/8445 257/787 |
| 2014/0049923 A1* | 2/2014 | Ma ........................ | H10K 59/873 118/712 |

(Continued)

FOREIGN PATENT DOCUMENTS

| | | |
|---|---|---|
| CN | 1575050 A | 2/2005 |
| CN | 104051668 A | 9/2014 |

(Continued)

*Primary Examiner* — Eric W Jones
(74) *Attorney, Agent, or Firm* — Nathan & Associates Patent Agents Ltd.; Menachem Nathan

(57) ABSTRACT

Embodiments of the present application provide an encapsulation structure, a display panel and a method of manufacturing the display panel. The encapsulation structure includes the barrier structure layer. In the barrier structure layer, the first barrier layer is adopted to fix the protrusion structure, and the second barrier layer is utilized to wrap the protrusion structure. The encapsulation structure provided by the embodiment of the present application implements the effective wrapping on the protrusion structure, solves the crack problem of the barrier layer caused by the protrusion structure, and thus enhances the service lifetime and reliability of the display panel.

20 Claims, 2 Drawing Sheets

(58) Field of Classification Search
USPC ................................................ 257/40, 59, 99
See application file for complete search history.

(56) References Cited

U.S. PATENT DOCUMENTS

| | | | | |
|---|---|---|---|---|
| 2014/0264300 A1* | 9/2014 | Kamiya | ............... | H10K 59/122 |
| | | | | 257/40 |
| 2016/0043151 A1* | 2/2016 | Kato | .................... | H10K 59/124 |
| | | | | 257/40 |
| 2018/0218883 A1* | 8/2018 | Iwao | ................. | H01L 21/67253 |
| 2019/0372052 A1 | 12/2019 | Kishimoto | | |
| 2020/0235335 A1 | 7/2020 | Kishimoto | | |

FOREIGN PATENT DOCUMENTS

| | | | |
|---|---|---|---|
| CN | 110447307 A | 11/2019 |
| CN | 110731126 A | 1/2020 |
| CN | 111512701 A | 8/2020 |
| CN | 111540843 A | 8/2020 |
| CN | 113053960 A | 6/2021 |
| WO | 2013051070 A1 | 4/2013 |

* cited by examiner

100

10

10

10

DISPLAY PANEL ENCAPULATION STRUCTURE AND METHOD OF MANUFACTURING THE SAME

FIELD OF INVENTION

The present application relates to a technical field of a display, and more particularly to a display panel and a method of manufacturing the same.

BACKGROUND OF INVENTION

An organic light-emitting diode (OLED) display has the self-luminous property and does not need any backlight source. The OLED display further has the advantages including the high contrast, wide color gamut, thin thickness, fast response, application to a flexible panel and the like. However, the OLED device is sensitive to water and oxygen, and needs to be effectively encapsulated to isolate the OLED device from the water and oxygen. A common encapsulation method is to form a water and oxygen barrier film on the OLED panel. However, protrusion structures are frequently present on the OLED device, and tend to cause cracks in the barrier film. These cracks become channels through which the water and oxygen invade, thereby shortening the service lifetime of the OLED panel.

SUMMARY OF INVENTION

An embodiment of the present application provides a display panel and a method of manufacturing the display panel to lengthen the service lifetime of the OLED panel.

Technical Solutions

The embodiment of the present application provides a display panel including:

an array substrate;

a light-emitting device disposed on the array substrate, wherein a side surface of the light-emitting device away from the array substrate has a protrusion structure; and an encapsulation structure including one or multiple barrier structure layers, the barrier structure layer or each of the barrier structure layers including: a first barrier layer embedded with the protrusion structure, wherein the first barrier layer includes a first part and a second part, the first part is disposed on a side surface of the light-emitting device away from the array substrate, the second part is disposed on one side of the protrusion structure away from the array substrate, and a gap is formed between the first part and the second part; and a second barrier layer wrapping the protrusion structure and the gap and extending to a side surface of the first barrier layer away from the array substrate.

Optionally, in some embodiments of the present application, the first part is formed with multiple limit slots, and the protrusion structures are correspondingly disposed in the limit slots.

Optionally, in some embodiments of the present application, a thickness of the first barrier layer is smaller than a height of the protrusion structure.

Optionally, in some embodiments of the present application, the thickness of the first barrier layer ranges from 10% to 50% of the height of the protrusion structure.

Optionally, in some embodiments of the present application, the thickness of the first barrier layer is greater than a thickness of the second barrier layer.

Optionally, in some embodiments of the present application, the thickness of the second barrier layer ranges from 5 nm to 50 nm.

Optionally, in some embodiments of the present application, a material of the first barrier layer is selected from a group consisting of nitride, oxide and nitrogen oxide.

Optionally, in some embodiments of the present application, a material of the first barrier layer is selected from a group consisting of nitride, oxide and nitrogen oxide.

Optionally, in some embodiments of the present application, the encapsulation structure further includes an organic layer disposed on one side of the barrier structure layer.

Optionally, in some embodiments of the present application, the encapsulation structure includes the two barrier structure layers, and the organic layer is disposed between the two barrier structure layers.

Optionally, in some embodiments of the present application, the encapsulation structure further includes an inorganic layer, and the organic layer is disposed between the barrier structure layer and the inorganic layer.

Optionally, in some embodiments of the present application, a thickness of the inorganic layer ranges from 20 nm to 1500 nm.

Optionally, in some embodiments of the present application, a material of the inorganic layer is selected from a group consisting of nitride, oxide and nitrogen oxide.

Optionally, in some embodiments of the present application, a material of the organic layer is selected from a group consisting of an ultra-violet light sensitive polymer, an epoxy polymer and an acrylic polymer.

Optionally, in some embodiments of the present application, a thickness of the organic layer ranges from 1 μm to 5 μm.

Optionally, in some embodiments of the present application, the display panel further includes a flat filling layer disposed on one side of the encapsulation structure away from the array substrate.

Optionally, in some embodiments of the present application, the protrusion structure includes particles, a gel or impurities.

Correspondingly, the embodiment of the present application further provides a method of manufacturing the display panel, the method including steps of: providing an array substrate; disposing a light-emitting device on the array substrate, wherein a side surface of the light-emitting device away from the array substrate has a protrusion structure; disposing a first part on a side surface of the light-emitting device away from the array substrate, and disposing a second part on one side of the protrusion structure away from the array substrate with a gap being formed between the first part and the second part to form a first barrier layer, wherein the protrusion structure is embedded into the first barrier layer; and disposing, on one side of the first barrier layer embedded with the protrusion structure, a second barrier layer wrapping the protrusion structure and the gap, and extending to a side surface of the first barrier layer away from the array substrate.

Optionally, in some embodiments of the present application, the step of disposing the first part on the side surface of the light-emitting device away from the array substrate and disposing the second part on the one side of the protrusion structure away from the array substrate with the gap being formed between the first part and the second part to form the first barrier layer includes: transferring the array substrate disposed with the light-emitting device into a chamber, and introducing a reaction gas into the chamber; and ionizing the reaction gas to form reactive plasma, wherein the reactive plasma undergoes a chemical reaction and is deposited on one side of the light-emitting device away from the array substrate to form the first part; and the reactive plasma undergoes the chemical reaction and is deposited on the one side of the protrusion structure away from the array substrate to form the second part with the gap being formed between the first part and the second part to form the first barrier layer and with the protrusion structure being embedded into the first barrier layer.

Optionally, in some embodiments of the present application, the step of disposing, on the one side of the first barrier layer embedded with the protrusion structure, the second barrier layer wrapping the protrusion structure and the gap and extending to the side surface of the first barrier layer away from the array substrate, includes: transferring the array substrate disposed with the light-emitting device and the first barrier layer into a chamber, and alternately introducing a first reaction gas and a second reaction gas into the chamber, wherein the first reaction gas and the second reaction gas are deposited on a side surface of the first barrier layer embedded with the protrusion structure and undergo a chemical reaction to form the second barrier layer wrapping the protrusion structure and the gap, and extending to the side surface of the first barrier layer away from the array substrate.

Useful Effect

The embodiment of the present application provides an encapsulation structure, a display panel and a method of manufacturing the display panel. The encapsulation structure includes the barrier structure layer. In the barrier structure layer, the first barrier layer is adopted to fix the protrusion structure, and the second barrier layer is utilized to wrap the protrusion structure. Even through cracks of the first barrier layer are formed at the protrusion structure, wrapping of the second barrier layer still can perform the effective encapsulation. Because the protrusion structure has been fixed by the first barrier layer, no crack is formed in the second barrier layer due to the movement of the protrusion structure. The encapsulation structure provided by the embodiment of the present application implements the effective wrapping on the protrusion structure, solves the crack problem of the barrier layer caused by the protrusion structure, and thus enhances the service lifetime and reliability of the display panel.

DESCRIPTION OF DRAWINGS

In order to explain the technical solution in the present application more clearly, the drawings required for the description of the embodiments will be briefly introduced. Obviously, the drawings in the following description only relate to some embodiments of the present application. Other drawings can be obtained from these drawings without creative works for those skilled in the art.

DETAILED DESCRIPTION OF EMBODIMENTS

Figure 1:
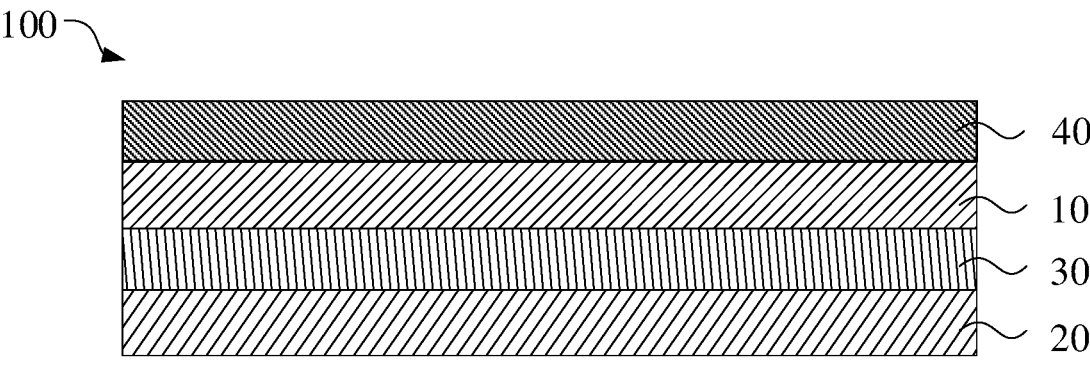
FIG. 1 is a schematic structure view showing a display panel provided by an embodiment of the present application.

The technical solutions in the embodiments of the present application will be clearly and completely described below in conjunction with the drawings in the embodiments of the present application. Obviously, the embodiments described are only a part of the embodiments of the present application, rather than all the embodiments. Based on the embodiments in the present application, all other embodiments obtained by those skilled in the art without creative works should be deemed as falling within the claims of the present application. In addition, it should be understood that the specific implementations described here are only used to illustrate and explain the present application without limiting the present application. In the present application, unless otherwise described, the used orientation words, such as "upper" and "lower", generally refer to the upper and lower positions of the device in the actual using or working state, and specifically refer to the drawing directions in the drawings; and "inner" and "outer" refer to the outline of the device.

The embodiments of the present application provide an encapsulation structure, a display panel and a method of manufacturing the display panel. Detailed descriptions will be respectively made in the following. It should be noted that the order of descriptions in the following embodiments is not intended to limit the preferred order of the embodiments.

Figure 2:
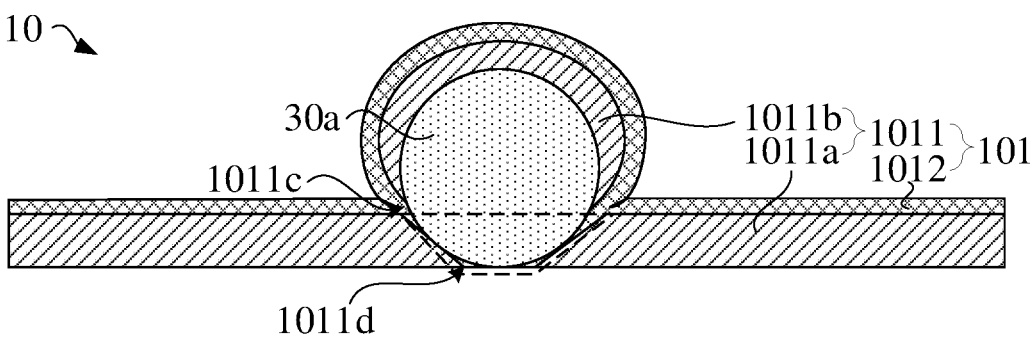
FIG. 2 is a first schematic structure view showing an encapsulation structure of the display panel provided by the embodiment of the present application.

FIG. 1 is a schematic structure view showing a display panel provided by an embodiment of the present application. FIG. 2 is a first schematic structure view showing an encapsulation structure of the display panel provided by the embodiment of the present application. Referring to FIGS. 1 and 2, a display panel 100 of the embodiment of the present application includes an array substrate 20, a light-emitting device 30 and an encapsulation structure 10. The light-emitting device 30 is disposed on the array substrate 20. The encapsulation structure 10 is disposed on one side of the light-emitting device 30 away from the array substrate 20. The encapsulation structure 10 includes one or multiple barrier structure layers 101. The barrier structure layer 101 includes a first barrier layer 1011 and a second barrier layer 1012. On the first barrier layer 1011 is embedded with a protrusion structure 30a. The first barrier layer 1011 includes a first part 1011a and a second part 1011b. The first part 1011a is disposed on a side surface of the light-emitting device 30 away from the array substrate 20. The second part 1011b is disposed on one side of the protrusion structure 30a away from the array substrate 20. A gap 1011c is formed between the first part 1011a and the second part 1011b. The second barrier layer 1012 is disposed on one side of the first barrier layer 1011 embedded with the protrusion structure 30a. The second barrier layer 1012 wraps the protrusion structure 30a and the gap 1011c, and extends to a side surface of the first barrier layer 1011 away from the array substrate 20.

Optionally, the protrusion structure 30a includes particles, a gel or impurities. Before the display panel is encapsulated, some protrusion structures 30a which cannot be completely removed are present on the light-emitting device. For example, the protrusion structures 30a include dust particles and gel impurities formed by the dust and water molecules upon panel transferring, or splashing impurities formed upon panel cutting. The presence of these protrusion structures 30a affects the smoothness of the barrier layer in the encapsulation structure 10 upon packaging, thereby causing cracks in the barrier layer. The cracks caused by these protrusion structures become channels through which the water and oxygen invade, wherein the water and oxygen affect the device performance, and thus shorten the service lifetime of the display panel.

The display panel 100 provided by the embodiment of the present application includes the encapsulation structure 10, which includes the barrier structure layer 101. In the barrier structure layer 101, the first barrier layer 1011 is adopted to fix the protrusion structure 30a, and the second barrier layer 1012 is utilized to wrap the protrusion structure 30a. Even though the first barrier layer 1011 is formed with cracks (i.e., the gap 1011c in the present application) at the protrusion structure 30a, the wrapping of the second barrier layer 1012 still can perform the effective encapsulation. Because the protrusion structure 30a has been fixed by the first barrier layer 1011, no crack is formed in the second barrier layer 1012 due to the movement of the protrusion structure 30a. The encapsulation structure 10 provided by the embodiment of the present application implements the effective wrapping on the protrusion structure 30a, solves the crack problem of the barrier layer caused by the protrusion structure 30a, and thus enhances the service lifetime and reliability of the display panel.

Optionally, the first part 1011a is formed with multiple limit slots 1011d. The protrusion structures 30a are correspondingly disposed in the limit slots 1011d. Forming the limit slots 1011d in the first part 1011a can limit the positions of the protrusion structures 30a, prevent the positions of the protrusion structures 30a from being moved, prevent the second barrier layer 1012 from being damaged, and prevent the second barrier layer 1012 from forming the cracks due to the movement of the protrusion structure 30a.

Optionally, the thickness of the first barrier layer 1011 ranges from 10% to 50% of the height of the protrusion structure 30a. Specifically, the thickness of the first barrier layer 1011 may be equal to 10%, 15%, 20%, 25%, 30%, 35%, 40%, 45% or 50% of the particle size of the protrusion structure 30a. For example, when the protrusion structure 30a is the dust particle, the particle size of the dust is usually smaller than or equal to 5 μm, and the thickness of the first barrier layer 1011 may range from 0.5 μm to 2.5 μm. The thickness of the first barrier layer 1011 is set according to the size of the protrusion structure 30a, so that the better fixing effect on the protrusion structure 30a can be achieved. If the thickness of the first barrier layer 1011 is smaller than 10% of the particle size of the protrusion structure 30a, then the protrusion structure 30a cannot be effectively fixed, and the movement of the protrusion structure 30a may be caused to damage the encapsulation of the second barrier layer 1012. Besides, the first barrier layer 1011 cannot implement the better water and oxygen barrier effect, and the encapsulation effect of the barrier structure layer 101 may be affected. If the thickness of the first barrier layer 1011 is greater than 50% of the particle size of the protrusion structure 30a, then the process and material costs will be increased. In addition, if the first barrier layer 1011 is too thick, then the problem of the poor film layer detachment tends to occur.

The encapsulation structure 10 may be provided with only one barrier structure layer 101 for encapsulation. One barrier structure layer 101 functioning as the encapsulation structure 10 can decrease the thickness of the encapsulation structure 10. When the barrier structure layer 101 is used in the flexible display panel package, the flexibility of the panel can be guaranteed. Meanwhile, because only one film structure is encapsulated, the thickness of the encapsulation structure 10 at the bending part of the flexible display panel is smaller, the bending radius can be effectively reduced, the border can be narrowed down, and the film layer rupture at the bending part can be avoided.

The material of the first barrier layer 1011 is selected from a group consisting of nitride, oxide and nitrogen oxide. Specifically, the nitride may be silicon nitride. The oxide may be aluminum oxide, silicon oxide, titanium oxide, zirconium oxide or zinc oxide. The nitrogen oxide may be silicon oxy-nitride. The material of the second barrier layer 1012 is selected from a group consisting of nitride, oxide and nitrogen oxide. Specifically, the nitride may be silicon nitride. The oxide may be aluminum oxide, silicon oxide, titanium oxide, zirconium oxide or zinc oxide. The nitrogen oxide may be silicon oxy-nitride.

The thickness of the second barrier layer 1012 may range from 5 nanometers (nm) to 50 nm. Specifically, the thickness of the second barrier layer 1012 is equal to 5 nm, 10 nm, 15 nm, 20 nm, 25 nm, 30 nm, 35 nm, 40 nm, 45 nm or 50 nm. The values mentioned hereinabove are just examples, and the thickness of the second barrier layer 1012 may be another value ranging from 5 nm to 50 nm. The second barrier layer 1012 is used to wrap the protrusion structure 30a. Therefore, the thickness of the second barrier layer is proper when the wrapping of the protrusion structure 30a can be guaranteed. If the thickness of the second barrier layer 1012 is smaller than 5 nm, then the second barrier layer 1012 cannot sufficiently wrap the protrusion structure 30a, and the second barrier layer 1012 may be broken, thereby affecting the encapsulation effect. If the thickness of the second barrier layer 1012 is greater than 50 nm, then the thickness of the encapsulation structure 10 and the material cost are increased.

Optionally, the thickness of the first barrier layer 1011 is greater than the thickness of the second barrier layer 1012. The first barrier layer 1011 is used to fix the protrusion structure 30a. The second barrier layer 1012 is used to wrap the protrusion structure 30a and the gap 1011c on the first barrier layer 1011. Therefore, the first barrier layer 1011 needs to have the larger thickness to fix the protrusion structure 30a in a better manner, and the thickness of the second barrier layer 1012 only needs to guarantee the wrapping of the protrusion structure 30a and the gap 1011c to achieve the better encapsulation effect.

Figure 3:
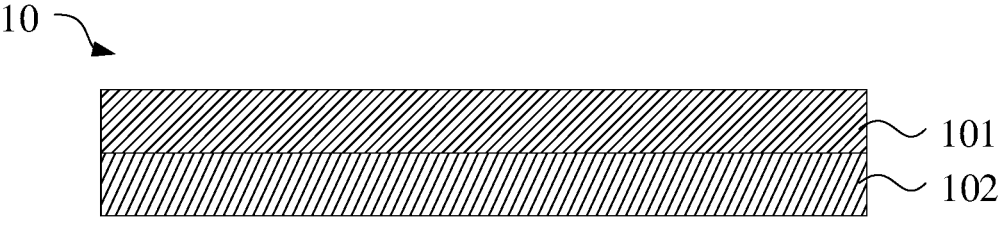
FIG. 3 is a second schematic structure view showing the encapsulation structure of the display panel provided by the embodiment of the present application.

FIG. 3 is a second schematic structure view showing the encapsulation structure of the display panel provided by the embodiment of the present application. Optionally, referring to FIG. 3, the encapsulation structure 10 further includes an organic layer 102 disposed on one side of the barrier structure layer 101. The material of the organic layer 102 is selected from a group consisting of an ultra-violet light sensitive polymer, an epoxy polymer and an acrylic polymer. Specifically, the material of the organic layer 102 may be an organic material, such as epoxy resin, polyimide (PI), polyethylene terephthalate (PET), polycarbonate (PC), polyethylene (PE), polyester acrylate (PEA), polymethylmethacrylate (PMMA) and the like. The organic layer 102 may be disposed on one side of the barrier structure layer 101 away from the light-emitting device 30 or disposed on one side of the barrier structure layer 101 close to the light-emitting device 30.

The thickness of the organic layer 102 ranges from 1 μm to 5 μm. Specifically, the thickness of the organic layer 102 may be equal to 1 μm, 1.5 μm, 2 μm, 2.5 μm, 3 μm, 3.5 μm, 4 μm, 4.5 μm or 5 μm. The values mentioned hereinabove are just examples, the thickness of the organic layer 102 may further be another value ranging from 1 μm to 5 μm. The thickness of the organic layer 102 may be configured according to the encapsulation requirement.

The organic layer 102 is made of the organic material. Combining the barrier structure layer 101 with the organic layer 102 in the encapsulation structure 10 can better lengthen the water vapor invading path and effectively block the water and oxygen. In addition, the surface of the organic layer 102 becomes smoother to enhance the interface quality of the barrier structure layer 101 and the organic layer 102, and further to effectively avoid the film layer detachment.

Figure 4:
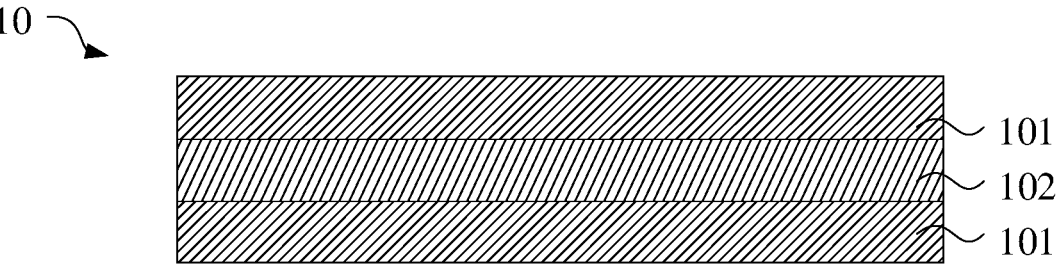
FIG. 4 is a third schematic structure view showing the encapsulation structure of the display panel provided by the embodiment of the present application.

FIG. 4 is a third schematic structure view showing the encapsulation structure of the display panel provided by the embodiment of the present application. Optionally, referring to FIG. 4, the encapsulation structure includes two barrier structure layers 101, and the organic layer 102 is disposed between the two barrier structure layers 101. Disposing the organic layer 102 between the two barrier structure layers 101 can make the barrier structure layer 101 form a structure similar to a stopper wall. After the organic layer 102 has adsorbed the water and oxygen, the barrier structure layer 101 can block the water and oxygen in the organic layer 102 and form a barrier space for containing the water and oxygen to prevent the water and oxygen from spreading and invading. Such the encapsulation structure 10 further enhances the water-oxygen-barrier performance and the encapsulation reliability.

Figure 5:
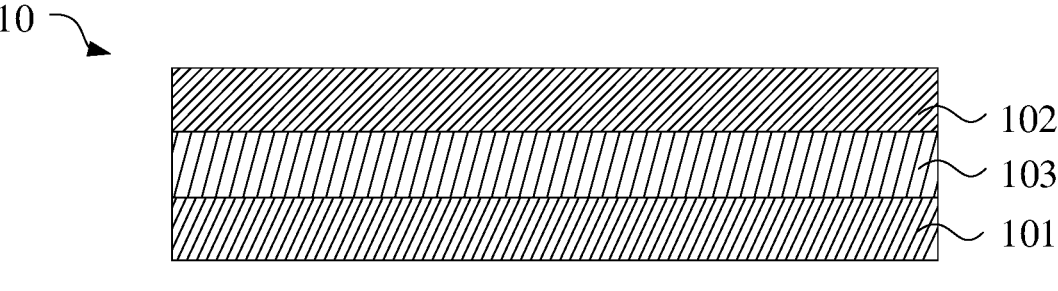
FIG. 5 is a fourth schematic structure view showing the encapsulation structure of the display panel provided by the embodiment of the present application.

FIG. 5 is a fourth schematic structure view showing the encapsulation structure of the display panel provided by the embodiment of the present application. Optionally, referring to FIG. 5, the encapsulation structure further includes an inorganic layer 103. The organic layer 102 is disposed between the barrier structure layer 101 and the inorganic layer 103. The material of the inorganic layer 103 is selected from a group consisting of nitride, oxide and nitrogen oxide. Specifically, the nitride may be silicon nitride. The oxide may be aluminum oxide, silicon oxide, titanium oxide, zirconium oxide or zinc oxide. The nitrogen oxide may be silicon oxy-nitride. Disposing the inorganic layer 103 in the encapsulation structure 10 and adopting the inorganic material and the organic material combined together to perform the encapsulation can obtain the better encapsulation effect. The inorganic layer 103 is used to block the water and oxygen, and the organic property of the organic layer 102 can be utilized to lengthen the water vapor invading path. Meanwhile, the organic layer 102 has the good step coverage and can perform the good coverage on the film layer which needs to be encapsulated. Combining the barrier structure layer 101, the organic layer 102 and the inorganic layer 103 together can enhance the water-oxygen-barrier ability of the encapsulation structure 10, and further lengthen the lifetime of the display panel.

The thickness of the inorganic layer 103 ranges from 20 nm to 1500 nm. Specifically, the thickness of the inorganic layer 103 may be equal to nm, 300 nm, 400 nm, 500 nm, 600 nm, 700 nm, 800 nm, 900 nm, 1000 nm, 1100 nm, 1200 nm, 1300 nm, 1400 nm or 1500 nm. The thickness of the inorganic layer 103 may be adaptively configured according to the encapsulation requirement. For example, when the barrier structure layer 101 and the organic layer 102 need to be configured as thinner, the thickness of the inorganic layer 103 can be properly increased to assure the encapsulation effect of the encapsulation structure.

The encapsulation structure provided by the present application may be applied to the package field of the organic light-emitting diode (OLED) display and function as a film encapsulation layer, and may also be applied to other electronic components, such as an organic solar cell, a chip and the like that tend to be affected by the water and oxygen. The barrier structure layer 101 may individually function as the encapsulation layer of the electronic device, and may also collocate with other encapsulation methods to achieve the better encapsulation effect.

Optionally, referring to FIG. 1, the display panel 100 further includes a flat filling layer 40 disposed on one side of the encapsulation structure 10 away from the array substrate 20.

The flat filling layer 40 may be a filler glue, which can make the display panel 100 effectively respond to the external pressure and block the water and oxygen, and further can smoothen the interface above the barrier structure layer 101. It is to be described that because the protrusion structure has the smaller height and the stronger dispersion, and there are fewer protrusion structures, encapsulating the protrusion structures in the display panel 100 does not affect the display effect. Performing the flattened package through the flat filling layer 40 also solves the flatness problem of the barrier structure layer 101.

Figure 6:
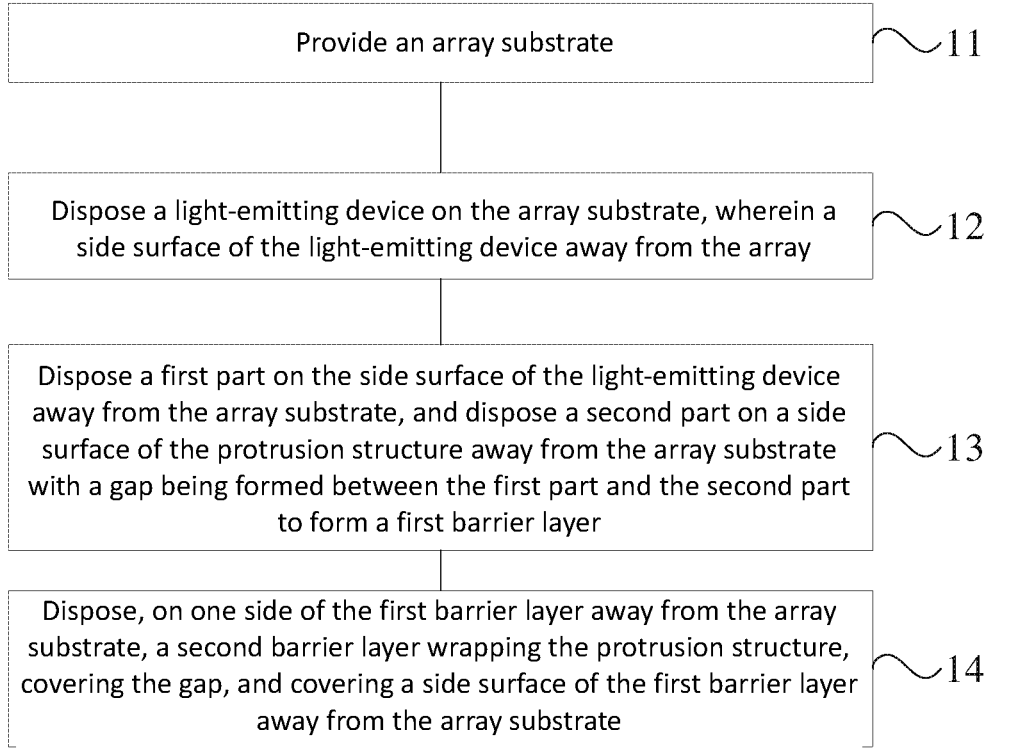
FIG. 6 is a schematic flow chart showing a method of manufacturing the display panel provided by the embodiment of the present application.

Correspondingly, the embodiments of the present application further provide a method of manufacturing the display panel. FIG. 6 is a schematic flow chart showing a method of manufacturing the display panel provided by the embodiment of the present application. Referring to FIG. 6, the method of manufacturing the display panel provided by the embodiment of the present application specifically includes the following steps:

In a step 11, an array substrate is provided.

The array substrate may include a backing material and a thin film transistor disposed on the backing material. The backing material may be glass, functional glass or a flexible backing material. The functional glass is obtained by sputtering a transparent metal oxide electroconductive film coating layer on the ultra-thin glass and then performing the high-temperature annealing treatment.

The glass, functional glass or flexible backing material is provided. Then, the thin film transistor is formed on the backing material. The specific method of manufacturing the thin film transistor is the common technical means in this field, and detailed descriptions thereof will be omitted.

In a step 12, a light-emitting device is disposed on the array substrate, wherein a side surface of the light-emitting device away from the array substrate has a protrusion structure.

The light-emitting device includes an anode, a light-emitting functional layer and a cathode successively stacked. Optionally, the light-emitting functional layer may include a hole injection layer, a hole transport layer, a light-emitting layer, an electron transport layer and an electron injection layer successively stacked. The light-emitting functional layer may further include a hole blocking layer and an electron blocking layer. The specific film layers and assembly of the light-emitting device are common technical means in this field, and detailed descriptions thereof will be omitted.

Due to the limitation of the process condition, the dust, gel or small molecular impurities are remained above the light-emitting device in the manufacturing process. In the present application, the protrusion structures may be the dust, gel or small molecular impurities, and may also be other protrusion structures affecting the encapsulation. The present application does not restrict the type and shape of the protrusion structure.

In a step 13, a first part is disposed on a side surface of the light-emitting device away from the array substrate, and a second part is disposed on one side of the protrusion structure away from the array substrate with a gap being formed between the first part and the second part to form a first barrier layer, and with the protrusion structure being embedded into the first barrier layer.

A plasma enhanced chemical vapor deposition (PECVD) method is adopted to dispose the first barrier layer on one side of the light-emitting device away from the array substrate. The first barrier layer is manufactured using the PECVD method at the low preparation temperature without affecting the light-emitting device, thereby guaranteeing the light-emitting efficiency of the light-emitting device. In addition, the PECVD method has the fast deposition rate, the good film formation quality and fewer micropores in the formed encapsulation structure, and cannot easily crack, so that the better encapsulation effect can be guaranteed.

Optionally, the step of disposing the first barrier layer on the one side of the light-emitting device away from the array substrate with the protrusion structure being embedded into the first barrier layer includes the following steps.

In a step 131, the array substrate disposed with the light-emitting device is transferred into a chamber, and a reaction gas is introduced into the chamber.

The reaction gas represents a precursor gas reacting in the chamber to form the nitride, oxide or nitrogen oxide of the first barrier layer. For example, when the material of the first barrier layer is silicon nitride ($SiN_x$), the reaction gas is a silane gas ($SiH_4$) and a nitrous oxide gas ($N_2O$).

In a step 132, the reaction gas is ionized to form reactive plasma.

The reaction gas may be ionized through micro-waves or radio frequency ionization. For example, the air pressure in the chamber and the radio frequency power are regulated to ionize the reaction gas by the radio frequency method.

In a step 133, the reactive plasma undergoes a chemical reaction and is deposited on a side surface of the light-emitting device away from the array substrate to form the first part, the reactive plasma undergoes the chemical reaction and is deposited on the one side of the protrusion structure away from the array substrate to form the second part with a gap being formed between the first part and the second part to form the first barrier layer, and with the protrusion structure being embedded into the first barrier layer.

Because the thickness of the first barrier layer ranges from 10% to 50% of the particle size of the protrusion structure, the first barrier layer cannot completely cover the protrusion structure after the first barrier layer has been deposited. Thus, the part of the protrusion structure is exposed from one side of the first barrier layer away from the array substrate, and the protrusion structure is embedded into the first barrier layer. In addition, because the second part is lifted by the protrusion structure, the second part is separated from the first part to form the gap.

In a step 14, a second barrier layer is disposed on one side of the first barrier layer embedded with the protrusion structure. The second barrier layer wraps the protrusion structure and the gap, and extends to the side surface of the first barrier layer away from the array substrate.

An atomic layer deposition (ALD) method is adopted to dispose the second barrier layer on one side of the first barrier layer embedded with the protrusion structure. Because the ALD method is the atomic layer-by-layer deposition, the deposition layer can exhibit extremely uniform thickness and excellent consistency. In addition, ALD adopts a self-limiting film formation method having the features of the strong step covering ability, and the strong water stop ability.

Optionally, the step of disposing, on the one side of the first barrier layer embedded with the protrusion structure, the second barrier layer wrapping the protrusion structure to form the barrier structure layer includes the following steps.

In a step 141, the array substrate disposed with the light-emitting device and the first barrier layer is transferred into a chamber, and the first reaction gas and the second reaction gas are alternately introduced into the chamber.

The first reaction gas and the second reaction gas represent precursor gases reacting in the chamber to form the nitride, oxide or nitrogen oxide of the second barrier layer. For example, when the material of the second barrier layer is silicon nitride ($SiN_x$), the first reaction gas may be the silane gas ($SiH_4$), and the second reaction gas may be the nitrous oxide gas ($N_2O$).

In a step 142, the first reaction gas and the second reaction gas are deposited on a side surface of the first barrier layer embedded with the protrusion structure and undergoes a chemical reaction to form the second barrier layer. The second barrier layer wraps the protrusion structure and the gap, and extends to a side surface of the first barrier layer away from the array substrate.

The surface reaction of the atomic layer deposition has the self-limiting ability. Actually, the self-limiting characteristic is the basis of atomic layer deposition technology. Continuously repeating the self-limiting reaction can form the desired film.

Specifically, the first reaction gas is inputted to the side surface of the first barrier layer embedded with the protrusion structure and is held on the surface through chemical adsorption. When the second reaction gas is introduced into the chamber, the second reaction gas reacts with the first reaction gas adsorbed to the surface of the first barrier layer. Displacement reactions occur between the first reaction gas and the second reaction gas and the corresponding byproduct is formed. When the first reaction gas on the surface is completely consumed, the reaction automatically stops and the desired atomic layer is formed. Thus, this is a self-limiting process, and continuously repeating the reaction can form the film.

Since the second barrier layer is formed using the ALD method, the thinner film layer can be prepared to wrap the protrusion structure. Meanwhile, using the self-limiting property of the ALD method obtains the second barrier layer with the strong step covering ability, implements the effective wrapping on the protrusion structure, and solves the crack problem of the barrier layer caused by the protrusion structure.

The method of manufacturing the display panel provided by the embodiment of the present application includes forming the barrier structure layer on the light-emitting device. The PECVD method is firstly used to prepare the first barrier layer, and the characteristic of the fast film formation of the PECVD method is utilized to make the thickness of the film reach 10% to 50% of the particle size of the protrusion structure, thereby obtaining the function of fixing the protrusion structure. Then, the ALD method is used to prepare the second barrier layer, and the "self-limiting" film formation characteristic of the method is utilized to prepare the continuous and uniform second barrier layer to cover the protrusion structure and the crack effectively. In the PECVD-ALD barrier structure layer of the present application, the film formation characteristics of PECVD and ALD are utilized to respectively provide the effectively fixing and covering functions to the protrusion structure, thereby enhancing the dense property of the film. Applying the barrier structure layer to the package of the display panel can effectively decrease the paths, through which the external water vapor enters the display panel device, thereby enhancing the lifetime and reliability of the display panel. In addition, the barrier structure layer has the simple structure and the wide applications, can effectively cover the protrusion structure, can decrease the water vapor invade channels, and can obtain the wide applications.

The display panel and the method of manufacturing the same provided by the embodiments of the present application have been introduced in detail. In this disclosure, specific examples are used to explain the principles and implementation of the present application. The descriptions of the above-mentioned embodiments are only used to help the understanding of the method and core idea of the present application. Meanwhile, those skilled in the art will make changes to the specific implementation and the application scope according to the idea of the present application. In summary, the contents of this specification should not be construed as a limitation to the present application.

What is claimed is:

1. A display panel, comprising:

an array substrate;

a light-emitting device disposed on the array substrate, wherein a side surface of the light-emitting device away from the array substrate has a protrusion structure; and an encapsulation structure comprising one or multiple barrier structure layers, the barrier structure layer or each of the barrier structure layers comprising:

a first barrier layer comprising a first part and a second part, wherein the first part is disposed on the side surface of the light-emitting device away from the array substrate, the second part is disposed on a side surface of the protrusion structure away from the array substrate, and a gap is formed between the first part and the second part to separate the first part from the second part; and a second barrier layer wrapping the protrusion structure, being at least partially in direct contact with the gap and covering the gap, and covering a side surface of the first barrier layer away from the array substrate.

2. The display panel according to claim 1, wherein the first part is formed with multiple limit slots, and the protrusion structures are correspondingly disposed in the limit slots.

3. The display panel according to claim 1, wherein a thickness of the first barrier layer is smaller than a height of the protrusion structure.

4. The display panel according to claim 3, wherein the thickness of the first barrier layer ranges from 10% to 50% of the height of the protrusion structure.

5. The display panel according to claim 1, wherein a thickness of the first barrier layer is greater than a thickness of the second barrier layer.

6. The display panel according to claim 1, wherein a thickness of the second barrier layer ranges from 5 nm to 50 nm.

7. The display panel according to claim 1, wherein a material of the first barrier layer is selected from a group consisting of nitride, oxide and nitrogen oxide.

8. The display panel according to claim 1, wherein a material of the second barrier layer is selected from a group consisting of nitride, oxide and nitrogen oxide;

wherein a part of a surface of the protrusion structure is exposed from the gap, and the second barrier layer is in contact with the exposed part of the surface of the protrusion structure.

9. The display panel according to claim 1, wherein the encapsulation structure further comprises an organic layer disposed on one side of the barrier structure layer.

10. The display panel according to claim 9, wherein the encapsulation structure comprises the barrier structure layers being two barrier structure layers, and the organic layer is disposed between the two barrier structure layers.

11. The display panel according to claim 9, wherein the encapsulation structure further comprises an inorganic layer, and the organic layer is disposed between the barrier structure layer and the inorganic layer.

12. The display panel according to claim 11, wherein a thickness of the inorganic layer ranges from 20 nm to 1500 nm.

13. The display panel according to claim 11, wherein a material of the inorganic layer is selected from a group consisting of nitride, oxide and nitrogen oxide.

14. The display panel according to claim 9, wherein a material of the organic layer is selected from a group consisting of an ultra-violet light sensitive polymer, an epoxy polymer and an acrylic polymer.

15. The display panel according to claim 9, wherein a thickness of the organic layer ranges from 1 μm to 5 μm.

16. The display panel according to claim 1, wherein the display panel further comprises a flat filling layer disposed on one side of the encapsulation structure away from the array substrate.

17. The display panel according to claim 1, wherein the protrusion structure comprises particles, a gel or impurities.

18. A method of manufacturing a display panel, the method comprising steps of:

providing an array substrate;

disposing a light-emitting device on the array substrate, wherein a side surface of the light-emitting device away from the array substrate has a protrusion structure;

disposing a first part of a first barrier layer on the side surface of the light-emitting device away from the array substrate, and disposing a second part of the first barrier layer on a side surface of the protrusion structure away from the array substrate with a gap being formed between the first part and the second part to separate the first part from the second part;

disposing, on one side of the first barrier layer away from the array substrate, a second barrier layer wrapping the protrusion structure, being at least partially in direct contact with the gap and covering the gap, and covering a side surface of the first barrier layer away from the array substrate.

19. The method according to claim 18, wherein the step of disposing the first part on the side surface of the light-emitting device away from the array substrate, and disposing the second part on the side surface of the protrusion structure away from the array substrate with the gap being formed between the first part and the second part to form the first barrier layer comprises:

transferring the array substrate disposed with the light-emitting device into a chamber, and introducing a reaction gas into the chamber; and ionizing the reaction gas to form reactive plasma, wherein:

the reactive plasma undergoes a chemical reaction, and is deposited on the side surface of the light-emitting device away from the array substrate to form the first part;

the reactive plasma undergoes the chemical reaction and is deposited on one side of the protrusion structure away from the array substrate to form the second part, wherein the gap is formed between the first part and the second part to form the first barrier layer.

20. The method according to claim 18, wherein the step of disposing, on the one side of the first barrier layer away from the array substrate, the second barrier layer wrapping the protrusion structure, covering the gap, and covering the side surface of the first barrier layer away from the array substrate comprises:

transferring the array substrate disposed with the light-emitting device and the first barrier layer into a chamber, and alternately introducing a first reaction gas and a second reaction gas into the chamber, wherein:

the first reaction gas and the second reaction gas are deposited on the side surface of the first barrier layer embedded with the protrusion structure and undergo a chemical reaction to form the second barrier layer wrapping the protrusion structure and the gap, and covering the side surface of the first barrier layer away from the array substrate.

\* \* \* \* \*